United States Patent [19]

Berger et al.

[11] Patent Number: 4,888,567
[45] Date of Patent: Dec. 19, 1989

[54] VOLTAGE-CONTROLLED CRYSTAL OSCILLATOR WITH VARIABLE PHASE FEEDBACK

[75] Inventors: Philippe Berger; Pierre A. Berland; Patrick Douziech, all of Villingen-Schwenningen, Fed. Rep. of Germany

[73] Assignee: Deutsche Thomson-Brandt GmbH, Villingen, Fed. Rep. of Germany

[21] Appl. No.: 250,731

[22] Filed: Sep. 28, 1988

[30] Foreign Application Priority Data

Sep. 30, 1987 [DE] Fed. Rep. of Germany ....... 3732906

[51] Int. Cl.[4] ............................................. H03B 5/36
[52] U.S. Cl. ................................. 331/116 R; 331/158
[58] Field of Search ............ 331/116 R, 116 FE, 158, 331/159

[56] References Cited

U.S. PATENT DOCUMENTS 3,691,475  9/1972  Mouri et al. ................ 331/116 R X
4,733,200  3/1988  Ecklund et al. ................ 331/116 R Primary Examiner—Siegfried H. Grimm
Attorney, Agent, or Firm—Max Fogiel

[57] ABSTRACT

A voltage-controlled oscillator in which a phase shifter is connected to a ceramic piezoelectric resonator. The phase shifter has a first circuit branch containing an amplifier. A second circuit branch is connected in parallel with the first circuit branch and includes a low-pass filter connected in series with a controllable amplifier and switch. The output of the controllable amplifier is applied to a first input of the switch, and a source of reference potential is connected to a second input of that switch. The switch has an output connected to a summing element at a first input of the summing element. A second input of that summing element is connected to the amplifier in the first circuit branch. The output of the summing element is fed back to the ceramic piezoelectric resonator.

2 Claims, 1 Drawing Sheet

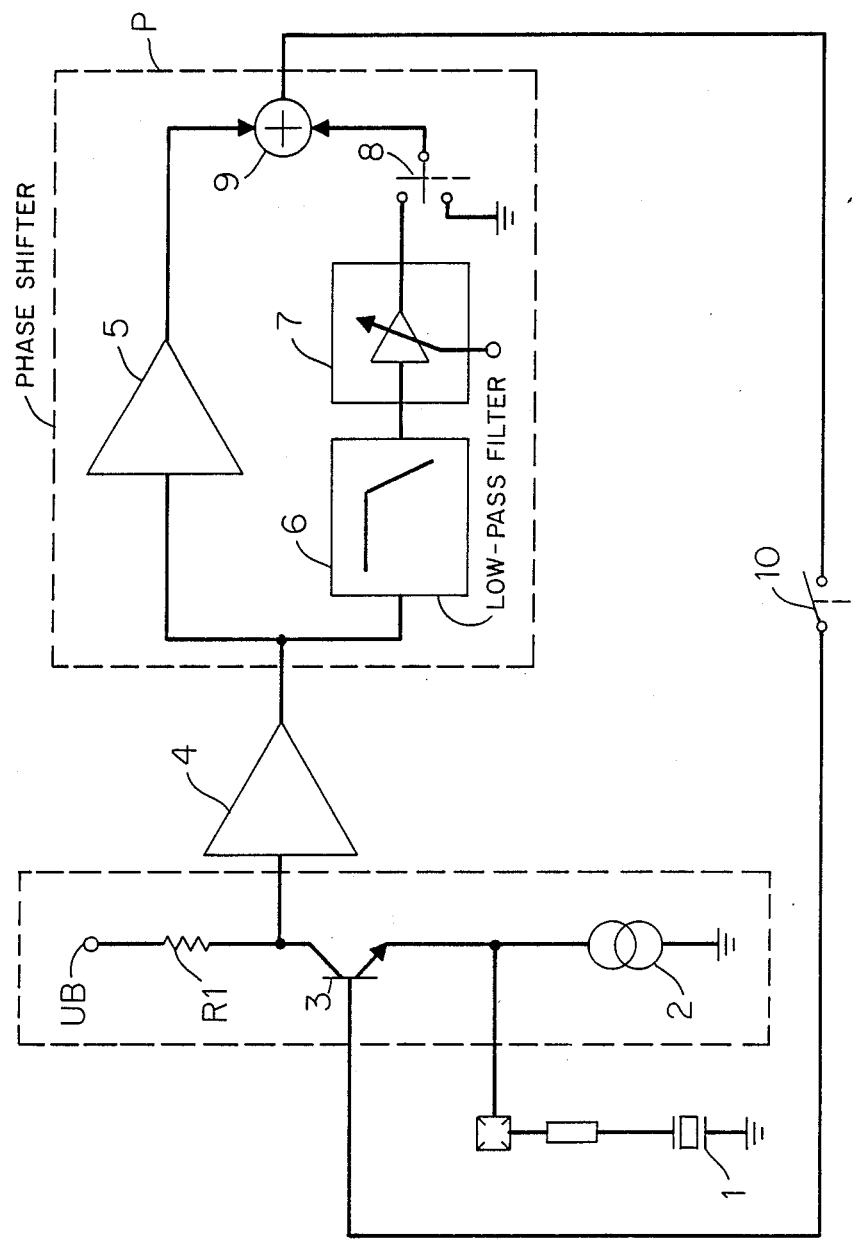

VOLTAGE-CONTROLLED CRYSTAL OSCILLATOR WITH VARIABLE PHASE FEEDBACK

The invention concerns a voltage-controlled oscillator with a ceramic piezoelectric resonator.

BACKGROUND OF THE INVENTION

Television receivers with a teletext decoder whereby several pages of teletext can be stored and displayed on the screen are known. The reliable prevention of flickering requires a very precisely voltage-controlled oscillator. Most voltage-controlled oscillators have a ceramic piezoelectric resonator.

Since voltage-controlled oscillators with ceramic piezoelectric resonators have both an analog and a digital input terminal, they have, when they are part of an integrated circuit, several contacts or "pins," and pins are expensive.

SUMMARY OF THE INVENTION

The object of the invention is accordingly to improve a voltage-controlled oscillator with a ceramic piezoelectric resonator to the extent that it can function with only one pin and its frequency can still be voltage controlled.

This object is attained in accordance with the invention in that the output voltage from the ceramic piezoelectric resonator is forwarded to the input terminal of a phase shifter with two parallel branches, in that one branch contains an amplifier, in that the other branch contains a low-pass filter, a controllable amplifier, and a controllable changeover switch, one input terminal of which is connected to the output terminal of the controllable amplifier, the other input terminal of which is at reference potential, and the output terminal of which is connected to one input terminal of a summer, in that the output terminal of the amplifier is connected to the other input terminal of the summer, and in that the output terminal of the summer is fed back to the ceramic pieoelectric resonator.

The invention will now be described and its function then explained with reference to the embodiment illustrated in the figure.

BRIEF DESCRIPTION OF THE DRAWING

An electrical schematic diagram showing the essential elements of the present invention.

DESCRIPTION OF THE PREFERRED EMBODIMENT

One connection of a parallel circuit illustrated in FIG. 1 and consisting of a ceramic piezoelectric resonator 1 and of a source 2 of current is at reference potential and the other connection is connected to the emitter of a transistor 3. The collector of transistor 3 is connected to the input terminal of an amplifier 4 and is supplied with a power-supply voltage UB by way of a resistor R1. The output terminal of amplifier 4 is connected to the input terminal of an amplifier 5 and to a low-pass filter 6, the output terminal of which is connected to the input terminal of a controllable amplifier 7. The output terminal of controllable amplifier 7 is connected to one input terminal of a controllable changeover switch 8, the other input terminal of which is at reference potential. The output terminal of controllable changeover switch 8 is connected to one input terminal of a summer 9, the other input terminal of which is connected to the output terminal of amplifier 5. The output terminal of summer 9 is fed back to the base of transistor 3 by way of a controllable switch 10.

Amplifier 5 is in one branch and low-pass filter 6, controllable amplifier 7, and controllable changeover switch 8 in the other branch of a phase shifter P. When the phase shift between the signals at the first and the second input terminal of summer 9 is zero, the ceramic pieoelectric resonator will oscillate at its resonance frequency. This situation is attained by setting the amplification of controllable amplifier 7 to zero. It can, however, also be attained more easily and precisely by switching controllable changeover switch 8 over to its second input terminal, placing the first input terminal of summer 9 at reference potential. When, accordingly, the voltage-controlled oscillator changes its frequency, controllable changeover switch 8 must be switched over in such a way that its first input terminal is connected to the output terminal of controlled amplifier 7. If, then, a positive amplification is selected for controllable amplifier 7, the phase shift will be greater than zero. When the phase shift is greater than zero, the frequency of the ceramic piezoelectric resonator will be increased, whereas, when the phase shift is less than zero, it will be decreased. The frequency of the ceramic piezoelectric resonator is accordingly decreased by making an amplification of controllable amplifier 7 negative.

The frequency of the piezoelectric resonator 1 illustrated in the drawing, and hence the frequency of the voltage-controlled oscillator, is varied by varying the voltage at the control input terminal of controllable amplifier 7. Controllable changeover switch 8 can be switched over to immediately and precisely set the voltage-controlled oscillator to the resonance frequency of the ceramic piezoelectric resonator.

We claim:

1. A voltage-controlled oscillator comprising: a ceramic piezoelectric resonator having an output voltage; phase shifting means connected to said ceramic piezoelectric resonator and receiving said output voltage; said phase shifting means having a first branch with amplifier means; a second branch connected in parallel with said first branch and having a low-pass filter connected in series with a controllable amplifier and switching means; said controllable amplifier having an output connected to a first input of said switching means; a source of reference potential connected to a second input of said switching means; summing means having a first input connected to an output of said switching means; said summing means having a second input connected to said amplifier means of said first branch; said summing means having an output fed back to said ceramic piezoelectric resonator.

2. A voltage-controlled oscillator as defined in claim 1, including a source of current connected parallel with said ceramic piezoelectric resonator, said source of current being connected with said ceramic piezoelectric resonator at a first junction; a source of reference potential connected to said first junction; a transistor with an emitter, said source of current being connected to said ceramic piezoelectric resonator at a second junction, said second junction being connected to said emitter of said transistor; said amplifier comprising a first amplifier, said transistor having a collector; a second amplifier having an input connected to said collector of said transistor; a source of power supply voltage connected to said collector of said transistor; said second amplifier having an output connected to the input of said first amplifier and to the input of said low-pass filter; additional switching means, said transistor having a base; said output of said summing means being connected to said base of said transistor through said additional switching means.

* * * * *